(12) United States Patent
Uesaka

(10) Patent No.: US 8,218,976 B2
(45) Date of Patent: Jul. 10, 2012

(54) OPTICAL RECEIVER WITH TRANS-IMPEDANCE RESPONDING IN BIT-BY-BIT TO INPUT SIGNAL

(75) Inventor: Katsumi Uesaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 280 days.

(21) Appl. No.: 12/651,632

(22) Filed: Jan. 4, 2010

(65) Prior Publication Data
US 2010/0172657 A1    Jul. 8, 2010

(30) Foreign Application Priority Data
Jan. 5, 2009    (JP) .................................. 2009-000186

(51) Int. Cl.
    *H04B 10/06*    (2006.01)
(52) U.S. Cl. ......................... 398/202; 398/206; 398/207
(58) Field of Classification Search ........... 398/202–214
    See application file for complete search history.

(56) References Cited

U.S. PATENT DOCUMENTS

| 5,801,588 | A  | * | 9/1998 | Nishiyama | 330/308 |
| 7,418,213 | B2 | * | 8/2008 | Denoyer | 398/210 |
| 7,912,380 | B2 | * | 3/2011 | Uesaka et al. | 398/202 |
| 2008/0232822 | A1 | * | 9/2008 | Furudate et al. | 398/202 |

FOREIGN PATENT DOCUMENTS

| JP | 10-335957 | 12/1998 |
| JP | 2003-163544 | 6/2003 |

* cited by examiner

*Primary Examiner* — Dzung Tran
(74) *Attorney, Agent, or Firm* — Smith Gambrell & Russell, LLP

(57) ABSTRACT

An optical receiver implemented with a pre-amplifier with an additional trans-impedance able to respond to the input signal in bit-by-bit is disclosed. The optical receiver provides a photodiode to convert an optical signal into a photocurrent, a trans-impedance amplifier to convert the photocurrent to a voltage signal, and an additional trans-impedance circuit able to respond instantaneously to the voltage signal. The additional trans-impedance includes a FET whose gate is fully fixedly biased and the source thereof receives the voltage signal. The FET may bypass the current flowing in the intrinsic trans-impedance instantaneously.

6 Claims, 5 Drawing Sheets

OPTICAL RECEIVER WITH TRANS-IMPEDANCE RESPONDING IN BIT-BY-BIT TO INPUT SIGNAL

BACKGROUND OF THE INVENTION

1. Field of the Invention

The present invention related to a circuit for receiving optical signal.

2. Related Prior Art

A pre-amplifier with a type of trans-impedance amplifier (hereafter denoted as TIA) for receiving optical signal is requested to enhance the input dynamic range thereof. For instance, Japanese Patent Application published as JP-H10-335957A has disclosed a trans-impedance amplifier with a diode element connected in parallel with the feedback impedance. When the input current to the TIA becomes large, the diode connected in parallel with the feedback impedance turns on to prevent the output of the TIA from saturating.

Another Japanese Patent application published as JP-2003-163544 has a TIA with an FET connected in parallel with the feedback impedance as an element showing a variable resistance. The U.S. Pat. No. 5,801,588, has also disclosed such a configuration of the TIA. In the U.S. Pat. No. 7,418,213, the FET connected in parallel with the feedback impedance varies the impedance thereof so as to bypass the input current by responding the average of the input current that is obtained by filtering the input current, when the input current to the TIA becomes large.

For the TIA with a diode element in parallel with the feedback impedance, a Schottky diode would be necessary as a device having a low forward saturation characteristic to retain the low power supply condition of the TIA. The Schottky device is sometimes hard to be monolithically integrated with other circuit devices. The arrangement where the FET connected in parallel with the feedback impedance is necessary additional feedback loop to control the FET by the average of the input signal, which inevitably causes a cut-off in lower frequency regions. A capacitor with relatively large capacitance is necessary to lower the cut-off frequency. However, such a capacitor is hard to be monolithically integrated within the circuit, while, an external capacitor with such large capacitance is likely to increase a size of the circuit.

SUMMARY OF THE INVENTION

The optical receiver according to the present invention comprises a photodiode (PD) configured to convert an optical signal into a photocurrent, a trans-impedance amplifier (TIA) including an intrinsic trans-impedance configured to convert the photocurrent into a voltage signal, and an additional trans-impedance configured to bypass the photocurrent flowing in the intrinsic trans-impedance when the optical signal becomes large. The present optical receiver has a feature that the additional trans-impedance responds instantaneously to the voltage signal output from the TIA.

The additional trans-impedance may include an FET whose drain coupled with the PD, gate is fixedly biased and source is coupled with an output of the TIA to receive a signal corresponding to the voltage signal without any filtering circuit. Because the source of the FET directly receives the signal corresponding to the voltage signal and the gate thereof is fixedly biased, the FET may respond the voltage signal instantaneously in bit-by-bit. Thus, the optical receiver of the present invention may dynamically enhance the dynamic range thereof without any particular circuit elements such as Schottky diode and any variable resistive element whose resistance is controlled by the filtered signal, which may make the optical receiver in compact.

BRIEF DESCRIPTION OF DRAWINGS

The invention may be more completely understood in consideration of the following detailed description of various embodiments of the invention in connection with the accompanying drawings, in which.

DESCRIPTION OF PREFERRED EMBODIMENTS

Next, preferred embodiments according to the present invention will be described in detail. In the description of the drawings, the same numerals or symbols will refer to the same elements without overlapping explanations.

Figure 1:
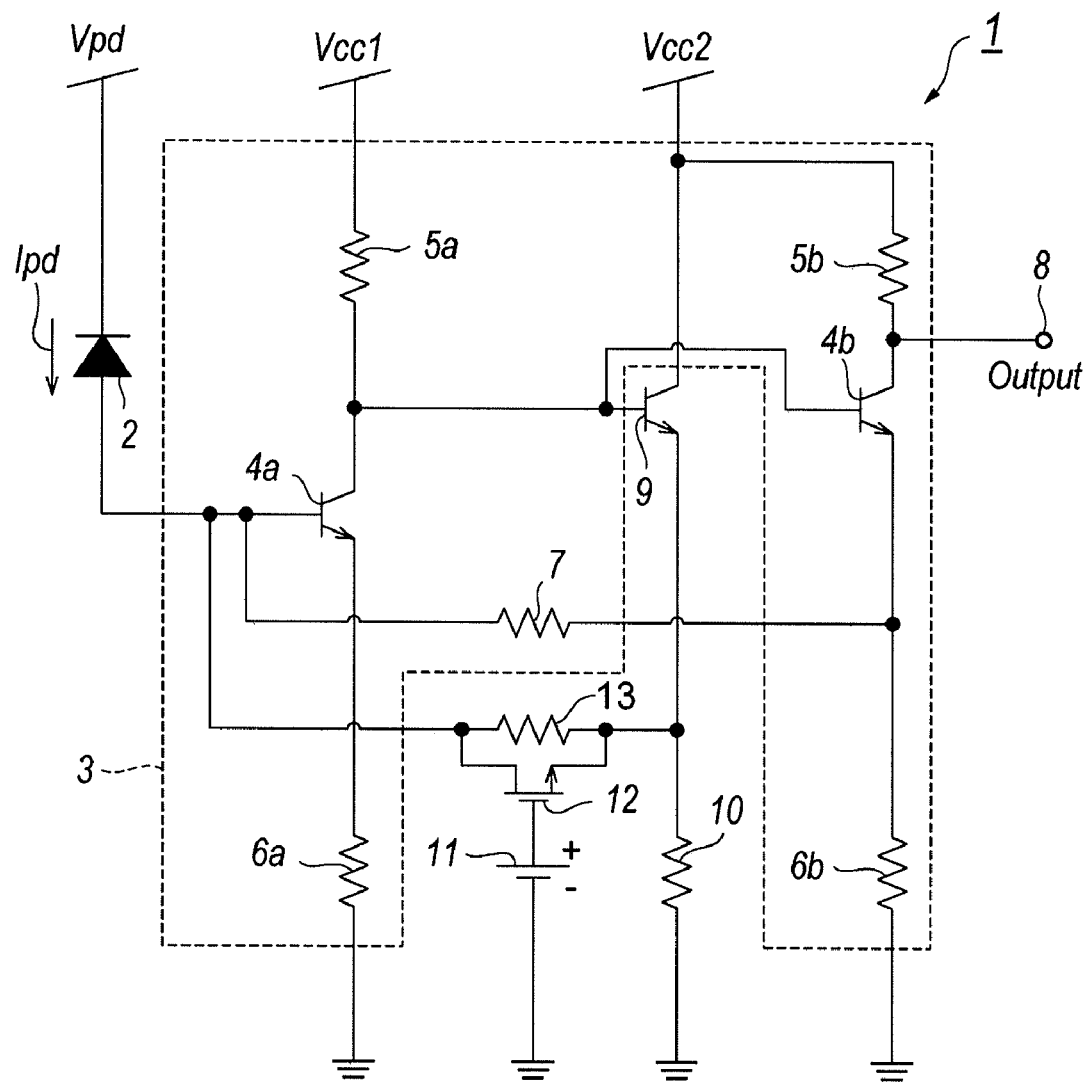
FIG. 1 is a circuit diagram of the optical receiver according to an embodiment of the present invention.

FIG. 1 is a circuit diagram of an optical receiver 1 according to an embodiment of the present invention. The optical receiver 1, which is often installed within an optical transceiver, converts an optical signal into an electrical signal. The optical receiver 1 comprises a semiconductor photodiode (hereafter denoted as PD) to convert the optical signal into a photocurrent Ipd, and a TIA 3 to convert the photocurrent into an output electrical signal Vout.

The PD 2, which is biased by a bias voltage Vpd, connected in a cathode thereof to the bias supply Vpd, while, the anode thereof is connected to the input of the TIA 3 to provide the photocurrent in the TIA 3.

The TIA 3 comprises, in the present embodiment, two npn-transistors, 4a and 4b, two load resistors, 5a and 5b, each connected with the collector of the transistors, two emitter resistors, 6a and 6b, each connected with the emitter of the transistors, and a feedback resistor 7 that determines the current-to-voltage conversion ration. In one 4a of the npn-transistors, which constitutes an amplifying section accompanied with the first load resistor 5a and the first emitter resistor 6a, the base thereof connects the anode of the PD 2, the collector is biased by the first power supply Vcc1 through the load resistor 5a, and the emitter is grounded through the emitter resistor 6a.

In the other 4b of the npn-transistors, which constitutes the following section accompanied with the second load resistor 5b and the second emitter resistor 6b, the base thereof is connected with the collector of the former transistor 4a to receive amplified signal, the collector is biased by the second power supply Vcc2 through the second load resistor 5b, and the emitter is grounded through the second emitter resistor 6b. The output of the TIA 3 is provided from the collector of the second transistor 4b. Further, a feedback resistor 7 is coupled between the input and the output of the TIA 3, that is, between the base of the first transistor 4a and the emitter of the second transistor 4b.

Figure 4:
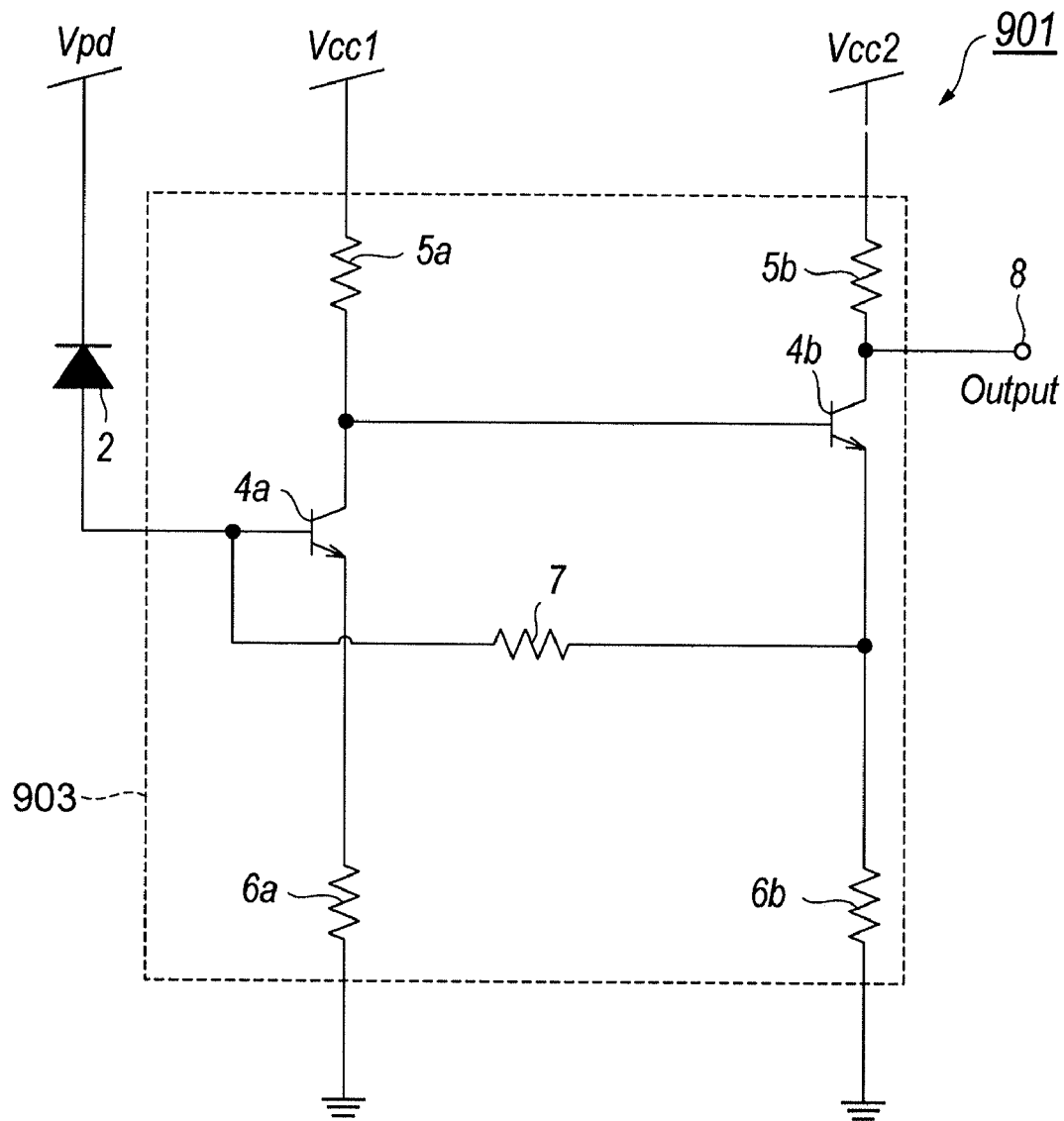
FIG. 4 is a circuit diagram of a conventional optical receiver.

In FIG. 1, the TIA 3 has the same arrangement with that of a conventional TIA 903 shown in FIG. 4. In the TIA 3 (903) thus configured, two npn-transistors, 4a and 4b, operate as the common emitter arrangement. A portion of the photocurrent Ipd generated by the PD 2 flows into the base of the first npn-transistor 4a, which is amplified by the transistor 4a to the collector current that causes a voltage drop in the load resistor 5a. This voltage drop is reflected to the base and the emitter potential of the second npn-transistor 4b. A rest portion of the photocurrent Ipd flows into the trans-impedance 7 to cause another voltage drop in the emitter potential of the second transistor 4b. Thus, the operating points of respective transistors, 4a and 4b, are automatically determined by the voltage drop caused in the trans-impedance 7 and that in the load resistor 5a.

Moreover, the optical receiver 1 further includes, as a circuit block accompanied with the TIA 3, the third npn-transistor 9, a third emitter resistor 10 connected with the emitter of the third transistor 9, an FET 12 whose gate is fixedly biased by the constant voltage source 11, and another trans-impedance 13 connected in parallel with the FET 13. The third npn-transistor 9 is connected in parallel to the second npn-transistor 4b, in which, the base thereof is connected with the base of the second transistor 4b, while the collector thereof is biased by the second power supply Vcc2. The emitter of the third transistor 9 is grounded through the third emitter resistor 10. Thus, the third transistor operates in substantially same as the second transistor 4b.

Setting the constant voltage source 11 such that, when the photocurrent Ipd is relatively small, the FET 12 is turned off, that is, the gate bias is set to cut the FET fully off, while, the photocurrent Ipd becomes relatively large, the FET 12 is turned on. Thus, implementing an additional trans-impedance of a parallel circuit of the FET 12 and the resistor 13, the photocurrent Ipd coming from the PD 2 is divided into three portions, one for the bias current of the first transistor 4a, one for the intrinsic trans-impedance 7, and the last for the additional trans-impedance, 12 and 13.

When the photocurrent Ipd is small, the FET 12 in the additional trans-impedance is turned off because the fixed gate bias thereof is set so as to turn off the FET 12; while, the photocurrent Ipd becomes large, because the fall of the emitter potential of the third transistor 9, which increase the gate bias so as to turn the FET 12 on automatically. Thus, the FET 12 operates so as to absorb the photocurrent Ipd instantaneously by receiving the emitter voltage of the third transistor 9 that is substantially comparable to the emitter voltage of the second transistor 4b but varies as following the input optical signal but independent of the output of the TIA 3. In other words, the FET 12 operates, when the photocurrent becomes large, so as to bypass the photocurrent flowing in the intrinsic trans-impedance 7. Because the source of the FET 12 is connected with the emitter of the third transistor 9 not the second transistor 4b, the turning on and off of the FET 12 may reflect the transition of the photocurrent.

When the additional trans-impedance, 12 and 13, is connected in parallel with the intrinsic trans-impedance 7, the additional trans-impedance merely reduces the trans-impedance of the TIA 3. Specifically, the current flowing in the trans-impedance 7 is still kept in the original current and flows in the emitter resistor 6b in the following section, even the current is shunt to a portion flowing in the intrinsic trans-impedance 7 and another portion flowing in the additional trans-impedance, 12 and 13.

Thus, such a configuration of the additional trans-impedance, 12 and 13, merely decreases the impedance value thereof. While, the present configuration of the additional trans-impedance, 12 and 13, may bypass the current flowing in the intrinsic trans-impedance 7 and may flow in the third emitter resistor 10 independent of the second emitter resistor 6b, which may widen the dynamic range of the TIA 3 compared with the case where the additional trans-impedance is connected fully in parallel to the intrinsic trans-impedance 7.

The photocurrent Ipd, except for the portion to bias the first transistor 4a, flows in the intrinsic trans-impedance 7 when the magnitude of the optical input signal which the photocurrent Ipd directly reflects; while, the FET 12 may bypass a portion of the photocurrent Ipd so as to decrease the current intrinsically flowing in the trans-impedance 7 automatically when the optical input signal becomes large. Thus, the optical receiver 1 may be prevented in the output 8 thereof from saturating under a large optical input, which may enlarge the dynamic range of the optical receiver 1.

The optical receiver 1 is free from a particular diode, any Schottky diode appeared in the first Japanese Patent application described previously, which may release the restriction originated to the semiconductor process. Moreover, because the gate circuit of the FET 12 does not provide any filtering circuit, which only include a constant voltage, the optical receiver 1 is unnecessary to provide any capacitor for the filter circuit, consequently, the size of the optical receiver 1 may be simplified.

Furthermore, the FET 12 is controlled in the gate thereof instantaneously by the signal substantially same as those output from the optical receiver 1. That is, the FET 12 may bypass the photocurrent Ipd bit-by-bit configuration. When the third transistor 9 has a same, or a substantially same performance with that of the second transistor 4b, the signal appeared in the emitter of the third transistor 9 may exactly reflect the signal appeared in the emitter of the second transistor 4b, which in turn the output signal of the optical receiver 1; accordingly, the optical receiver 1 may widen the dynamic range thereof by exactly tracing the frequency response of the input signal in bit-by-bit.

A conventional TIA generally shows a trade-off relation between the noise performance and the dynamic range thereof depending on the trans-impedance thereof. The optical receiver 1 of the present embodiment may automatically vary the trans-impedance depending on the magnitude of the input optical signal; accordingly, the noise performance and the dynamic range may be consistent in the present optical receiver 1.

Figure 2:
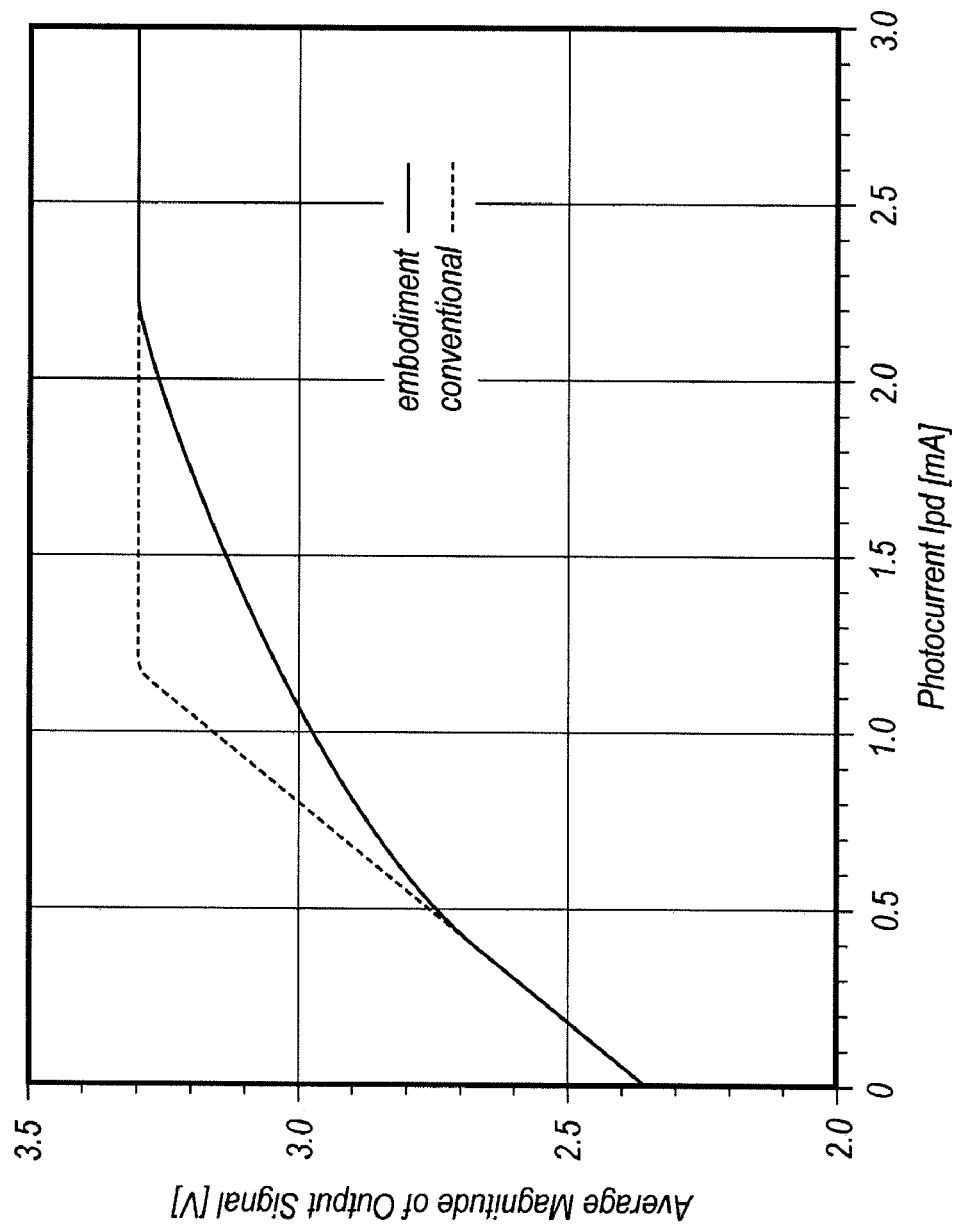
FIG. 2 compares simulation results of the average magnitude of the signal output from the optical receiver of the present embodiment with that from the conventional optical receiver.

FIG. 2 is a simulation of the average magnitude of the output signal against the input photocurrent Ipd, where the result in accordance with the present optical receiver 1 and that for a conventional optical receiver without any additional trans-impedance element driven in bit-by-bit of the input signal. In the simulation, it was assumed that the emitter resistor 6a was 0Ω, the second load resistor 5b and the other emitter resistors, 6b and 10 were 400Ω, the first load resistor 5a was 100Ω, the intrinsic trans-impedance 7 was 500Ω, and the additional trans-impedance 13 was 20 kΩ, respectively. The first power supply Vcc1 and the second power supply Vcc2 are set to be 2.5V and 3.5V, while, the constant voltage source 11 has the voltage of 1.33V.

In FIG. 2, the optical receiver 1 decreases the trans-impedance thereof when the input photocurrent exceeds about 0.5 mA and does not saturate until the photocurrent is greater than 2.0 mA. The trans-impedance corresponds to the slop of the behaviors shown in FIG. 2. On the other hand, the conventional optical receiver 901 keeps the trans-impedance thereof constant until the photocurrent becomes 1.2 mA and saturates the output signal thereof just after the photocurrent Ipd exceeds 1.2 mA.

Figure 3:
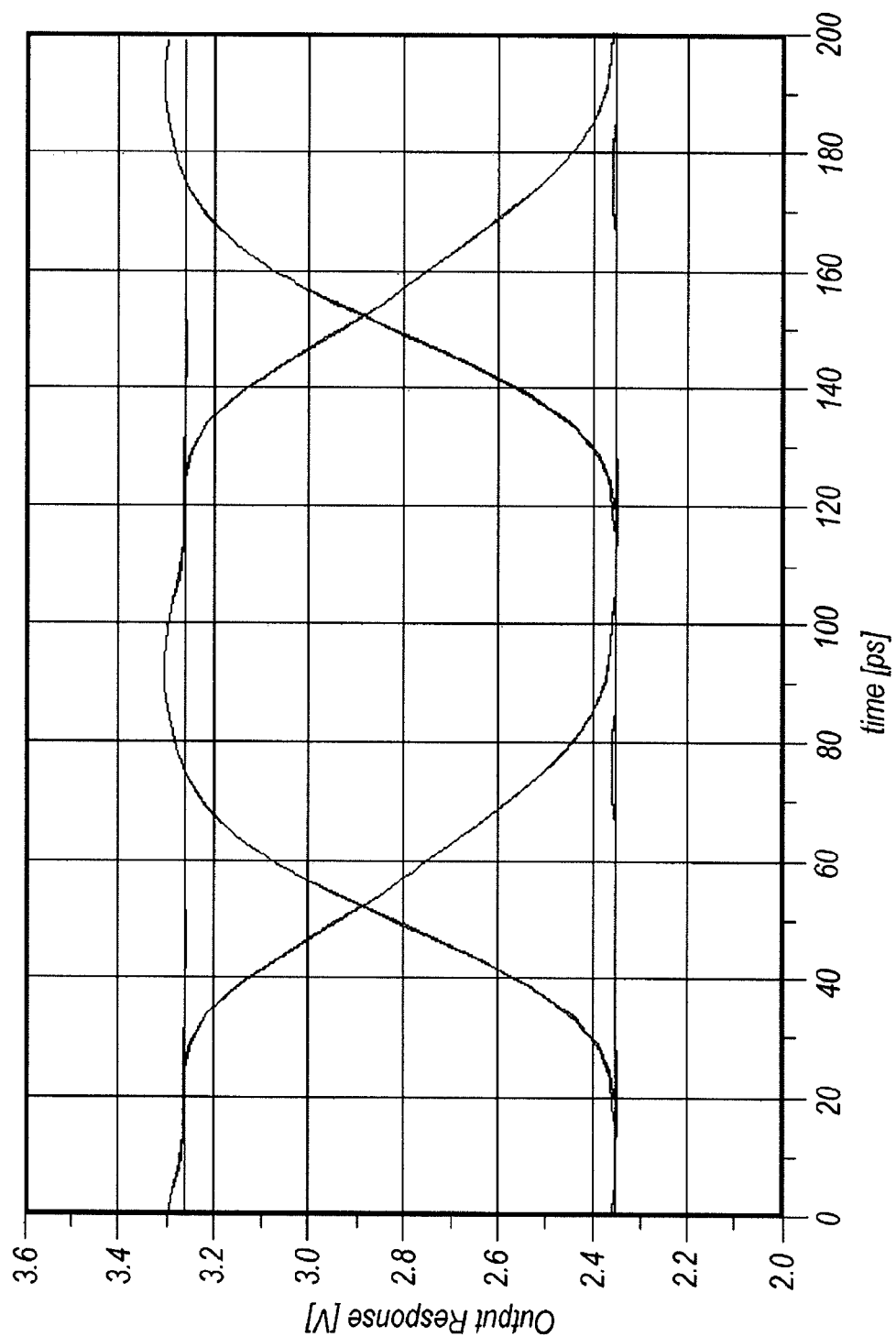
FIG. 3 is a simulation of the output response of the optical receiver according to the present embodiment.
Figure 5:
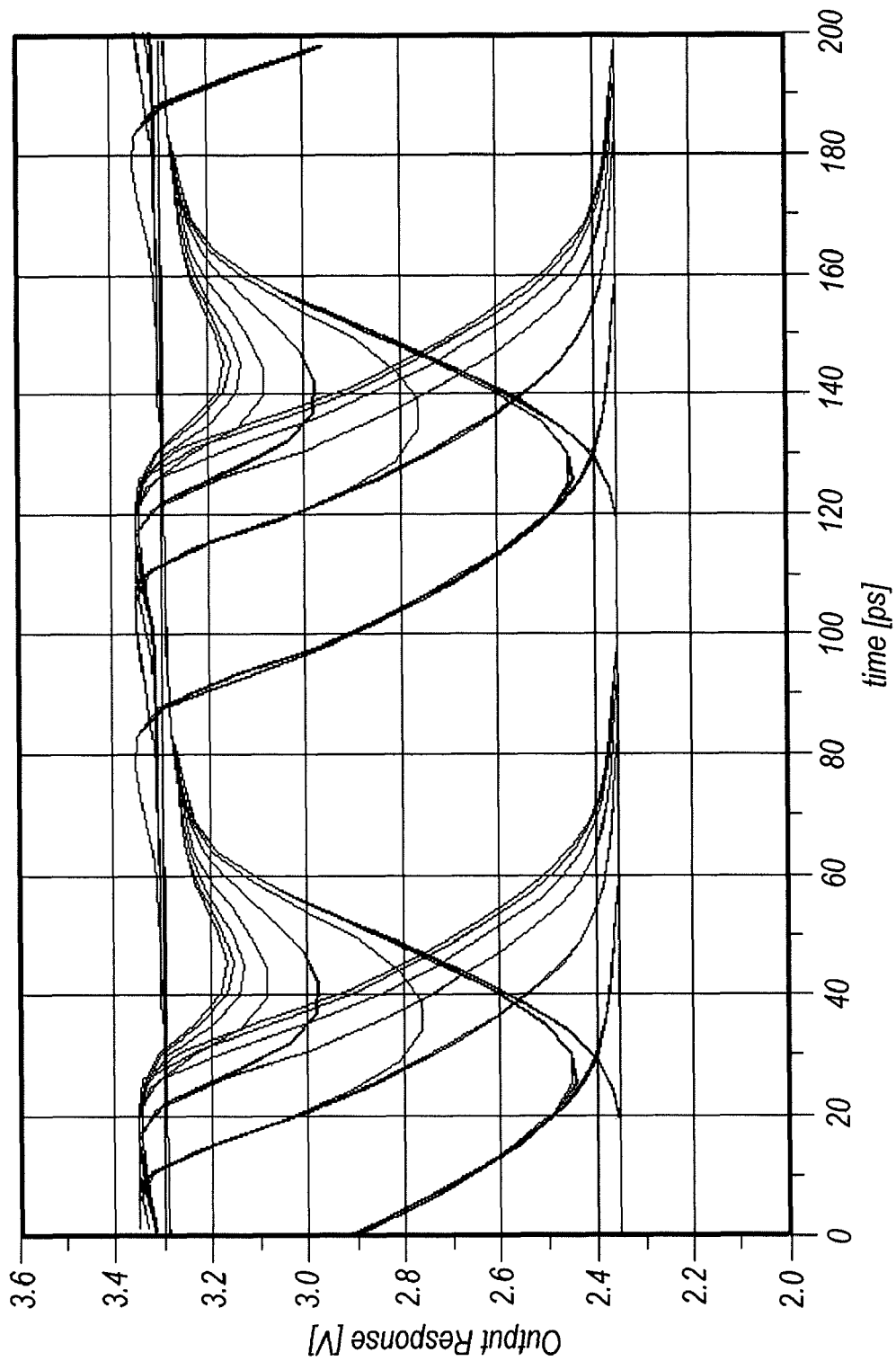
FIG. 5 shows a simulation of the output response of the conventional optical receiver shown in FIG. 4 that provides an additional trans-impedance element of the present invention.

FIGS. 3 and 5 show simulations results of the output signal derived from the optical receiver of the present embodiment (FIG. 3) and that from the conventional receiver 903 (FIG. 5). In the simulation, the photocurrent is set to be 2 mAp-p under the extinction ratio thereof is set to be infinite, that is, the photocurrent Ipd fully disappears when the optical signal corresponds to "OFF" state, while, the photocurrent Ipd becomes 2 mA when the optical signal is "ON" state; and the optical signal shows the modulation speed of 10 Gbps.

The optical receiver 1 of the present embodiment may output the signal with an enough eye and a lesser jitter performance as shown in FIG. 3. On the other hand, the conventional optical receiver 903 outputs the signal with substantially no eye open and larger jitter as shown in FIG. 5. Thus, the additional element whose trans-impedance may follow the input optical signal in bit-by-bit may enhance the dynamic range of the optical receiver without any particular circuit elements.

While there has been illustrated and described what are presently considered to be example embodiments of the present invention, it will be understood by those skilled in the art that various modifications may be made, and equivalents may be substituted, without departing from the true scope of the invention. For instance, the resistor 13 in the additional trans-impedance may be eliminated; the third npn-transistor 9 may provide the collector load resistor; the emitter resistors, 6b and 10, may be substituted for a current source; npn-transistors, 4a, 4b and 9, may be replaced to pnp-transistors; and bipolar transistors may be replaced to FETs. Such modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

I claim:

1. An optical receiver comprising:
   a photodiode configured to convert an optical signal into a photocurrent;
   a trans-impedance amplifier configured to convert said photocurrent into a voltage signal, said trans-impedance amplifier including an intrinsic trans-impedance; and
   an additional trans-impedance configured to bypass a current flowing in said intrinsic trans-impedance when said optical signal exceeds a predetermined magnitude, said additional trans-impedance including a field effect transistor with a drain, a source and a gate, said drain being connected to said photodiode, said gate being fixedly biased by a constant voltage source and said source receiving a signal corresponding to said voltage signal to respond thereto instantaneously.

2. The optical receiver of claim 1,
   wherein said additional trans-impedance further includes a bipolar transistor with a base and an emitter,
   wherein said base of said bipolar transistor of said additional trans-impedance is connected with said amplifying section and said emitter of said bipolar transistor in said additional trans-impedance is connected with said source of said field effect transistor.

3. An optical receiver comprising:
   a photodiode configured to convert an optical signal into a photocurrent;
   a trans-impedance amplifier configured to convert said photocurrent into a voltage signal, said trans-impedance amplifier including an intrinsic trans-impedance, an amplifying section with an input and a following section with an output, said input of said amplifying section being connected with said photodiode to receive and amplify said photocurrent, said following section being set in a downstream side of said amplifying section to output said voltage signal; and
   an additional trans-impedance configured to bypass a portion of said photocurrent entering said input of said amplifying section when said optical signal exceeds a predetermined magnitude,
   wherein said intrinsic trans-impedance is connected between said input of said amplifying section and an output side of said following section, and said additional trans-impedance is connected between said input of said amplifying section and a node independent of said output of said following section.

4. The optical receiver of claim 3,
   wherein said additional trans-impedance includes a field effect transistor with a drain, a source and a gate, and
   wherein said drain is connected with said input of said amplifying section, said gate is fixedly biased, and said source is independent of said output of said following section.

5. The optical receiver of claim 4,
   wherein said additional trans-impedance further includes a bipolar transistor with a base and an emitter,
   wherein said base of said bipolar transistor of said additional trans-impedance is connected with said amplifying section and said emitter of said bipolar transistor in said additional trans-impedance is connected with said source of said field effect transistor.

6. An optical receiver for outputting a voltage signal corresponding to a photocurrent generated by a photodiode by receiving an input optical signal, said optical receiver comprising:
   a trans-impedance amplifier including,
   an amplifying section with an input connected with said photodiode,
   a following section connected in a downstream side of said amplifying section, and
   an intrinsic trans-impedance amplifier connected between said input of said amplifying section and an output side of said following section; and
   an additional trans-impedance including,
   a bipolar transistor connected in substantially parallel with said following section with respect to said amplifying section, and
   a field effect transistor with a drain, a gate and a source, wherein said drain is connected with said input of said amplifying section, said base is fixedly biased, and said source is connected with an emitter of said bipolar transistor,
   wherein said additional trans-impedance bypasses said photocurrent flowing in said intrinsic trans-impedance instantaneously when said input optical signal becomes large.

* * * * *